(12) United States Patent
Lee

(10) Patent No.: US 10,180,693 B1
(45) Date of Patent: Jan. 15, 2019

(54) PROCESSING CIRCUIT AND METHOD THEREOF

(71) Applicant: Nuvoton Technology Corporation, Hsinchu Science Park (TW)

(72) Inventor: Bo-Yi Lee, Kaohsiung (TW)

(73) Assignee: Nuvoton Technology Corporation, Hsinchu Science Park (TW)

( * ) Notice: Subject to any disclaimer, the term of this patent is extended or adjusted under 35 U.S.C. 154(b) by 0 days.

(21) Appl. No.: 15/871,320

(22) Filed: Jan. 15, 2018

(30) Foreign Application Priority Data

Oct. 5, 2017 (TW) .............................. 106134346 A

(51) Int. Cl.
*G05F 1/46* (2006.01)
*G01R 19/165* (2006.01)
*H03K 17/22* (2006.01)

(52) U.S. Cl.
CPC ....... *G05F 1/468* (2013.01); *G01R 19/16576* (2013.01); *H03K 17/22* (2013.01)

(58) Field of Classification Search
CPC ........ H02M 3/10; H02M 3/155; H02M 3/156; H02M 3/158; G05F 1/10; G05F 1/46; G05F 1/468; G05F 1/56; G05F 1/575
See application file for complete search history.

(56) References Cited

U.S. PATENT DOCUMENTS

| 9,329,210 B1* | 5/2016 | Gupta | G01R 19/1659 |
| 2006/0028179 A1* | 2/2006 | Yudahira | G01R 19/16542 320/133 |
| 2011/0050670 A1* | 3/2011 | Kim | G05F 1/46 345/211 |
| 2013/0271095 A1* | 10/2013 | Jackum | G05F 1/56 323/270 |
| 2017/0054300 A1* | 2/2017 | Shao | G11C 17/16 |

FOREIGN PATENT DOCUMENTS

| TW | 200828817 A | 7/2008 |
| TW | 201004082 A | 1/2010 |
| TW | M374091 U | 2/2010 |
| TW | 20116844 A | 5/2011 |
| TW | 201616290 A | 5/2016 |

* cited by examiner

*Primary Examiner* — Adolf Berhane
(74) *Attorney, Agent, or Firm* — Muncy, Geissler, Olds & Lowe, P.C.

(57) ABSTRACT

A processing circuit including a reference voltage generator and a voltage detector is provided. The reference voltage generator is configured to generate a first reference voltage to a controller. The voltage detector is configured to detect the first reference voltage. When the first reference voltage is not within a predetermined range, the voltage detector triggers the reference voltage generator such that the reference voltage generator generates a second reference voltage to the controller. When the second reference voltage is lower than a predetermined value, the voltage detector resets the controller.

18 Claims, 7 Drawing Sheets

PROCESSING CIRCUIT AND METHOD THEREOF

CROSS REFERENCE TO RELATED APPLICATIONS

This Application claims priority of Taiwan Patent Application No. 106134346, filed on Oct. 5, 2017, the entirety of which is incorporated by reference herein.

BACKGROUND OF THE INVENTION

Field of the Invention

The invention relates to a processing circuit, and more particularly to a processing circuit that provides reference voltages.

Description of the Related Art

Each of the mobile electronic devices in common use today has a battery to provide power to the electronic elements disposed inside of the corresponding mobile electronic device. If the electronic elements consume more power, the power stored in the battery is reduced quickly. When the power stored in the battery is insufficient, the mobile electronic device cannot work normally.

BRIEF SUMMARY OF THE INVENTION

In accordance with an embodiment, a processing circuit comprises a reference voltage generator and a voltage detector. The reference voltage generator is configured to generate a first reference voltage to a controller. The voltage detector is configured to detect the first reference voltage. When the first reference voltage is not within a predetermined range, the voltage detector triggers the reference voltage generator such that the reference voltage generator generates a second reference voltage to the controller. When the second reference voltage is lower than a predetermined value, the voltage detector resets the controller.

An exemplary embodiment of a processing method is described in the following paragraph. A first reference voltage is provided to a controller. The first reference voltage is detected. When the first reference voltage is not within a predetermined range, a second reference voltage provided to the controller. The second reference voltage is detected. When the second reference voltage is lower than a predetermined value, the controller is reset.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
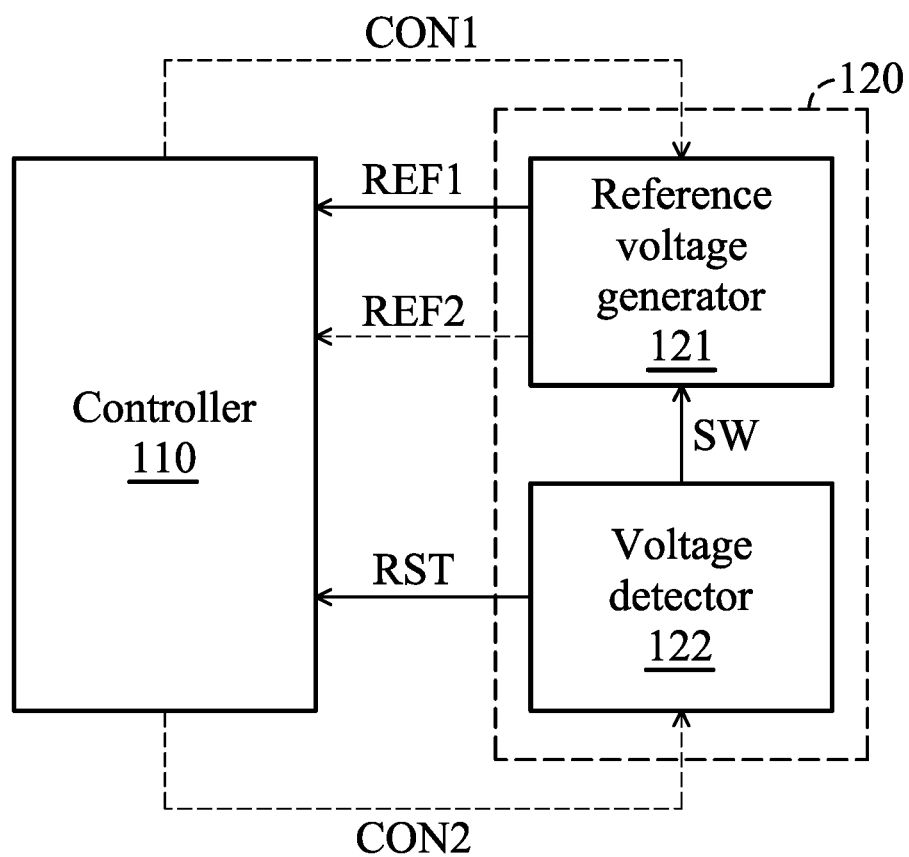
FIG. 1 is a schematic diagram of an exemplary embodiment of an operation system, according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Processing methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

FIG. 1 is a schematic diagram of an exemplary embodiment of an operation system, according to various aspects of the present disclosure. As shown in FIG. 1, the operation system 100 comprises a controller 110 and a processing circuit 120. The controller 110 receives a reference voltage REF1 and a reset signal RST provided by the processing circuit 120. In one embodiment, the controller 110 is a microcontroller unit (MCU) configured to control other elements, such as processors (not shown) and memories (not shown), according to the reference voltage REF1.

In addition, when the processing circuit 120 sends the reset signal RST, the controller 110 performs a reset operation. The reset operation may be to turn off the controller 110 or to reset the controller 110. In one embodiment, the controller 110 comprises a power on reset (POR) circuit (not shown). The reset signal RST is used to turn on the POR circuit. In other embodiments, before performing the reset operation, the controller 110 stores data from a volatile memory to a non-volatile memory to avoid loss of data.

In this embodiment, the processing circuit 120 comprises a reference voltage generator 121 and a voltage detector 122. The reference voltage generator 121 is configured to generate the reference voltage REF1 to the controller 110. The voltage detector 122 detects the reference voltage REF1 to generate a switching signal SW to the reference voltage generator 121. The reference voltage generator 121 processes the reference voltage REF1 according to the switching signal SW.

When the reference voltage REF1 is not within a predetermined range, such as 2.4V~1.5V, it means that the reference voltage REF1 is unstable. Therefore, the voltage detector 122 generates a switching signal SW to direct the reference voltage generator 121 to stabilize the reference voltage REF1. In this embodiment, the reference voltage generator 121 provides another stable reference voltage REF1. For example, during a first period, the reference voltage REF1 provided from the reference voltage generator 121 is 1.7V. In this case, when the reference voltage REF' is higher than a maximum value (e.g. 2.4V) of the predetermined range or lower than a minimum value (e.g. 1.5V) of the predetermined range, it means that the reference voltage REF1 is unstable. Therefore, the voltage detector 122 uses the switching signal SW to direct the reference voltage generator 121 to generate another new and stable reference voltage REF1. At this time, the new and stable reference voltage REF1 may be equal to 1.7V, but the disclosure is not limited thereto. In other embodiments, the new and stable reference voltage REF1 provided by the reference voltage generator 121 may be lower than or higher than the previous reference voltage REF1.

Additionally, in this embodiment, the reference voltage generator 121 provides a single reference voltage REF1) to the controller 110, but the disclosure is not limited thereto. In other embodiments, the reference voltage generator 121 may generate a plurality of reference voltages (e.g. REF1 and REF2) to the controller 110. The reference voltage REF2 may be equal to or unequal to the reference voltage REF1. In one embodiment, the reference voltage REF2 may be 1.8V and the reference voltage REF1 may be 1.7V, but the disclosure is not limited thereto.

In the present disclosure, the time points when the reference voltage generator 121 provides the reference voltages REF1 and REF2 to the controller 110 are not limited. In one embodiment, the reference voltage generator 121 simultaneously provides the reference voltages REF1 and REF2 to the controller 110. In this case, when a specific condition occurs, the reference voltage generator 121 only provides the reference voltage REF1 to the controller 110 and does not provides the reference voltage REF2 to the controller 110. In another embodiment, the reference voltage generator 121 only provides the reference voltage REF2 to the controller 110. When a specific condition occurs, the reference voltage generator 121 provides the reference voltage REF1 to the controller 110. In this case, the reference voltage generator 121 does not provide the reference voltage REF2 to the controller 110.

In one embodiment, the controller 110 may use a control signal CON1 to directly require the reference voltage generator 121 to provide at least one of the reference voltages REF1 and REF2. In another embodiment, the controller 110 may use a control signal CON2 to indirectly control the reference voltage generator 121. In this case, the voltage detector 122 directs the reference voltage generator 121 to provide at least one of the reference voltages REF1 and REF2 to the controller 110 according to the control signal CON2.

Figure 2A:
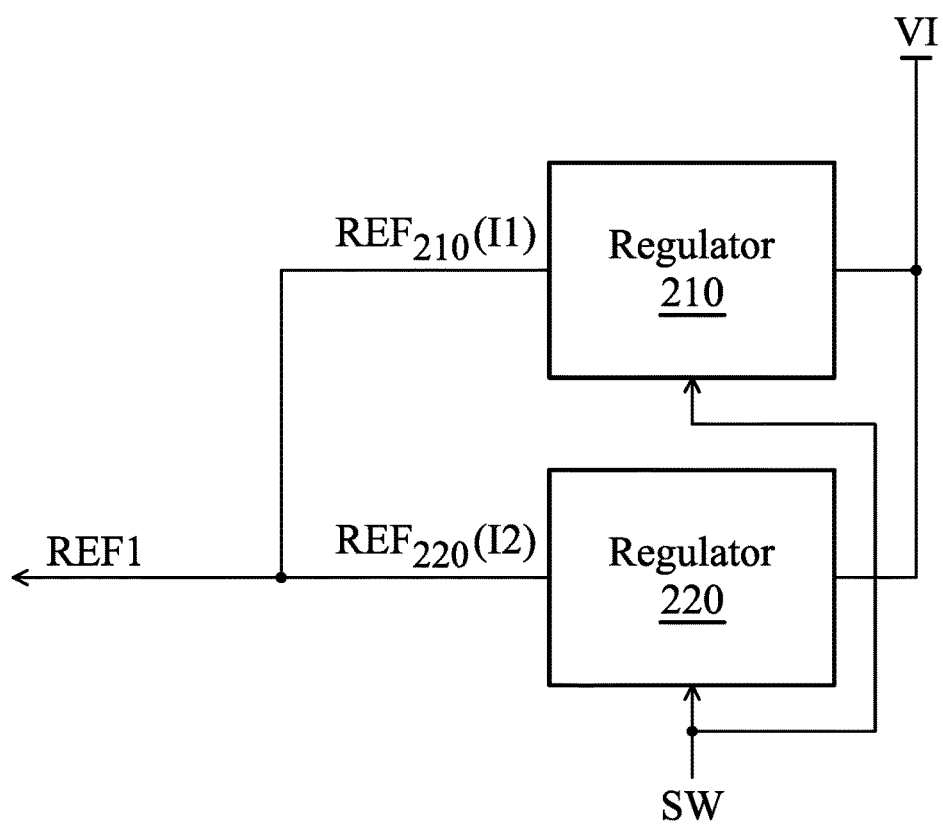
FIG. 2A is a schematic diagram of an exemplary embodiment of a reference voltage generator, according to various aspects of the present disclosure.

FIG. 2A is a schematic diagram of an exemplary embodiment of a reference voltage generator, according to various aspects of the present disclosure. As shown in FIG. 2A, the reference voltage generator 200A comprises regulators 210 and 220. The regulator 210 generates a reference voltage $REF_{210}$ according to an input voltage VI. In this embodiment, the regulator 210 determines whether to generate the reference voltage $REF_{210}$ according to the switching signal SW, but the disclosure is not limited thereto. In other embodiments, the regulator 210 determines whether to generate the reference voltage $REF_{210}$ according to the control signal CON1 provided from the controller 110. In other embodiments, when the regulator 210 provides the reference voltage $REF_{210}$, the regulator 210 further outputs a current I1 to the controller 11.

The regulator 220 generates a reference voltage $REF_{220}$ according to the input voltage VI. In this embodiment, the regulator 220 determines whether to generate the reference voltage $REF_{220}$ according to the switching signal SW, but the disclosure is not limited thereto. In some embodiments, the regulator 220 determines whether to generate the reference voltage $REF_{220}$ according to the control signal CON1 provided from the controller 110. In one embodiment, the reference voltage $REF_{220}$ is approximately equal to the reference voltage $REF_{210}$, such as 1.7V. In other embodiments, when the regulator 220 provides the reference voltage $REF_{220}$, the regulator 220 further provides a current I2 to the controller 110. In one embodiment, the current I2 is 10 uA, and the current I1 is 1 uA.

In the present disclosure, the kinds of regulators 210 and 220 are not limited. In one embodiment, the kind of regulator 210 may be the same as or different from the kind of regulator 220. In another embodiment, at least one of the regulators 210 and 220 is a low drop out (LDO) regulator or a micro LDO regulator. Furthermore, the source providing the input voltage VI is not limited. In one embodiment, the input voltage VI is provided from a power supply. In another embodiment, the input voltage VI is provided by a battery.

Assume that during an initial period, the regulator 210 generates the reference voltage $REF_{210}$ according to the switching signal SW. At this time, the reference voltage $REF_{210}$ is provided as the reference voltage REF1. The voltage detector 122 detects the reference voltage $REF_{210}$. When the reference voltage $REF_{210}$ is within a predetermined range, the regulator 210 continuously provides the reference voltage $REF_{210}$. However, when the reference voltage $REF_{210}$ is not within the predetermined range, the voltage detector 122 uses the switching signal SW to control the regulator 210 such that the regulator 210 stops providing the reference voltage $REF_{210}$. In this case, the voltage detector 122 uses the switching signal SW to trigger the regulator 220 such that the regulator 220 generates the reference voltage $REF_{220}$. At this time, the reference voltage $REF_{220}$ is provided as the reference voltage REF1. Since the reference voltage REF1 is maintained within a stable range, the controller 110 is capable of operating normally.

In another embodiment, the voltage detector 122 continuously detects the reference voltage $REF_{220}$. When the reference voltage $REF_{220}$ is too low, such as being lower than a predetermined value, or is not within the predetermined range, the voltage detector 122 sends a reset signal RST to reset the controller 110. The controller 110 operates in an initial mode according to the reset signal RST. During the initial mode, the controller 110 may use the voltage detector 122 to direct the regulator 210 to provide the reference voltage $REF_{210}$ again or use the control signal CON1 to direct the regulator 210 to provide the reference voltage $REF_{210}$ again.

However, when the reference voltage $REF_{220}$ is not too low, such as being lower than a predetermined value, or the reference voltage $REF_{220}$ is within the predetermined range, the regulator 220 continuously provides the reference voltage $REF_{220}$. In other embodiments, when the reference voltage $REF_{220}$ is not too low, such as being lower than a predetermined value, or the reference voltage $REF_{220}$ is within the predetermined range, the voltage detector 122 sends the switching signal SW to direct the regulator 210 provides the reference voltage $REF_{210}$ again. At this time, the reference voltage $REF_{210}$ is served as the reference voltage REF1 and the regulator 220 stops providing the reference voltage $REF_{220}$. In one embodiment, when the reference voltage $REF_{220}$ is not too low or within the predetermined range during a predetermined period, the regulator 210 again provides the reference voltage $REF_{210}$.

In this embodiment, the regulators 210 and 220 do not simultaneously operate. For example, when the regulator 210 generates the reference voltage $REF_{210}$, the regulator 220 does not generate the reference voltage $REF_{220}$. At this time, the reference voltage $REF_{210}$ is provided as the reference voltage REF1. However, when the regulator 220 generates the reference voltage $REF_{220}$, the regulator 210 does not generate the reference voltage $REF_{210}$. At this time, the reference voltage $REF_{220}$ is provided as the reference voltage REF1.

In this embodiment, the regulators 210 and 220 determine whether to work according to the same signal, such as the switching signal SW shown in FIG. 1, but the disclosure is not limited thereto. In other embodiments, the regulators 210 and 220 work according to different signals. For example, the regulator 210 works according to the control signal CON1 (not shown in FIG. 2A), and the regulator 220 works according to the switching signal SW.

Figure 2B:
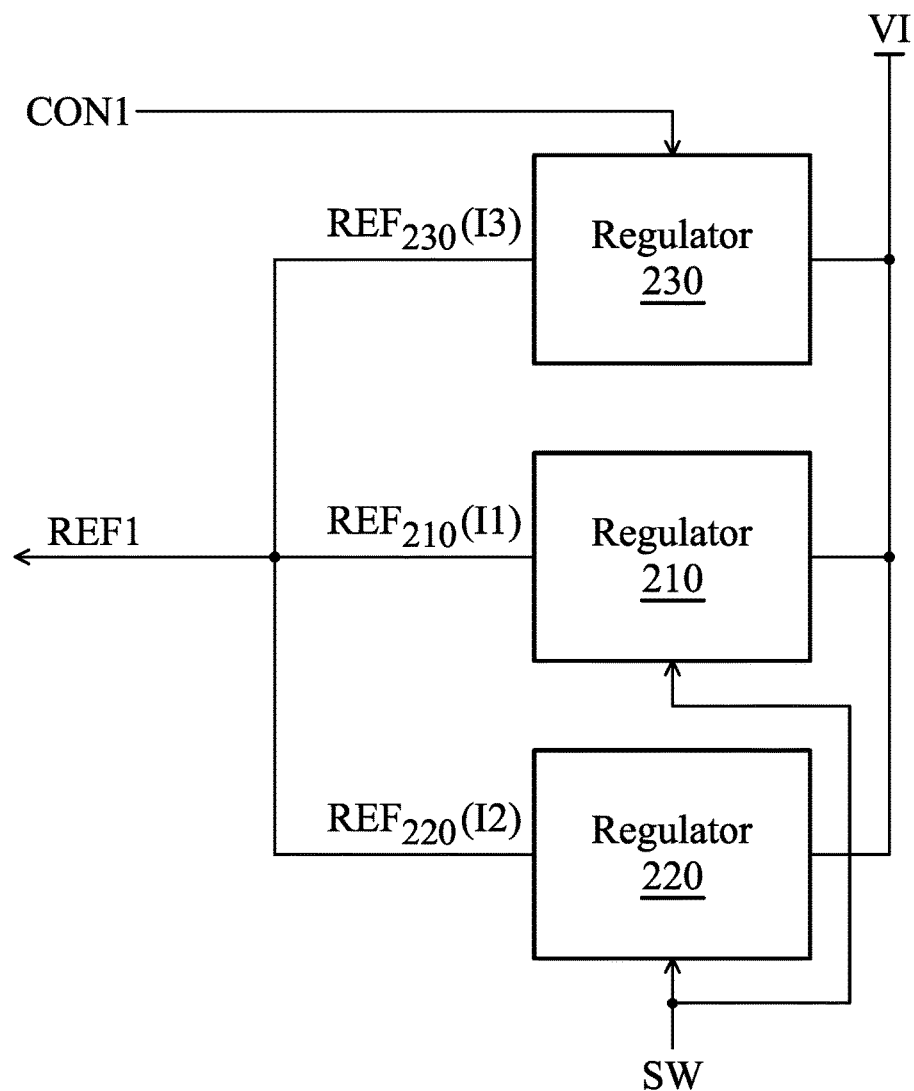
FIG. 2B is a schematic diagram of another exemplary embodiment of the reference voltage generator, according to various aspects of the present disclosure.

FIG. 2B is a schematic diagram of another exemplary embodiment of the reference voltage generator, according to various aspects of the present disclosure. FIG. 2B is similar to FIG. 2A with the exception that the reference voltage generator 200B further comprises a regulator 230. The regulator 230 generates a reference voltage $REF_{230}$ according to the input voltage VI. In this embodiment, the regulator 230 generates the reference voltage $REF_{230}$ according to the control signal CON1, but the disclosure is not limited thereto. In another embodiment, the regulator 230 may generate the reference voltage $REF_{230}$ according to the switching signal SW.

In this embodiment, the reference voltage $REF_{230}$ is different from each of the reference voltages $REF_{210}$ and $REF_{220}$. For example, the reference voltage $REF_{230}$ is 1.8V and the reference voltage $REF_{210}$ is 1.7V. In another embodiment, the reference voltage $REF_{230}$ is equal to the reference voltage $REF_{210}$ or $REF_{220}$. Additionally, when the regulator 230 generates the reference voltage $REF_{230}$, the regulator 230 also provides a current I3 to the controller 110. In one embodiment, the current I3 is different from each of the currents I1 and I2. For example, the current I3 may be greater than the currents I1 and I2.

In this embodiment, the regulators 210, 220 and 230 do not work simultaneously. For example, when the regulator 210 generates the reference voltage $REF_{210}$, the regulators 220 and 230 stop working. When the regulator 220 generates the reference voltage $REF_{220}$, the regulators 210 and 230 stop working. When the regulator 230 generates the reference voltage $REF_{230}$, the regulators 210 and 220 stop working.

When the regulator 230 generates the reference voltage $REF_{230}$, the reference voltage $REF_{230}$ is provided as the reference voltage REF1. When a specific condition occurs, the regulator 230 stops generating the reference voltage $REF_{230}$. The specific condition is that the level of the control signal CON1 is changed or the frequency of the control signal CON1 is changed. In one embodiment, the regulator 210 generates the reference voltage $REF_{210}$ according to the switching signal SW. At this time, the reference voltage $REF_{210}$ is provided as the reference voltage REF1. When the reference voltage $REF_{210}$ is not within a predetermined range, the regulator 210 stops generating the reference voltage $REF_{210}$ and the regulator 220 generates the reference voltage $REF_{220}$ according to the switching signal SW. At this time, the reference voltage $REF_{220}$ is provided as the reference voltage REF1. In another embodiment, when the reference voltage $REF_{220}$ is lower than a predetermined value, the regulator 210 generates the reference voltage $REF_{210}$ to maintain the level of the reference voltage REF1. In some embodiments, when the reference voltage $REF_{220}$ is lower than a predetermined value, the regulator 230 generates the reference voltage $REF_{230}$.

Figure 2C:
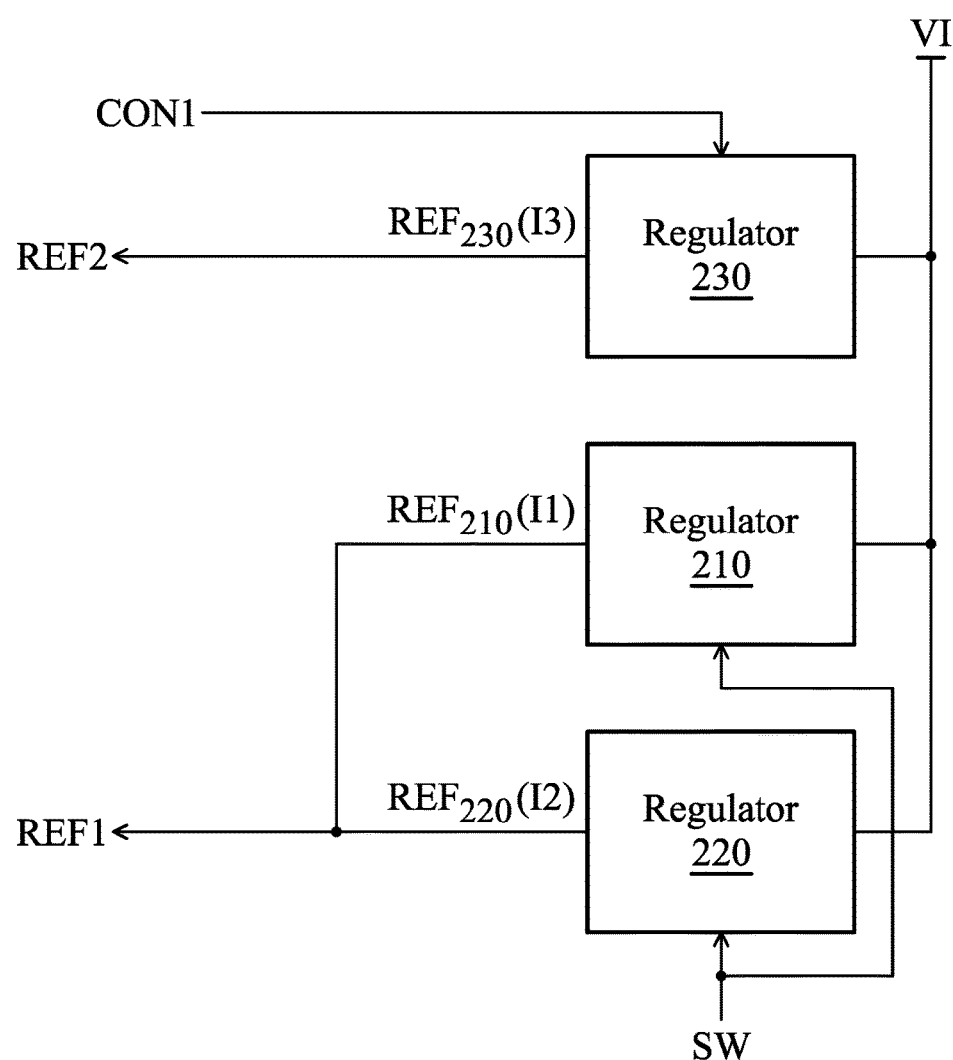
FIG. 2C is a schematic diagram of another exemplary embodiment of the reference voltage generator, according to various aspects of the present disclosure.

FIG. 2C is a schematic diagram of another exemplary embodiment of the reference voltage generator, according to various aspects of the present disclosure. FIG. 2C is similar to FIG. 2B except that the reference voltage $REF_{230}$ shown in FIG. 2C is served as the reference voltage REF2. In this embodiment, the regulator 230 generates the reference voltage $REF_{230}$ according to the control signal CON1, and the regulators 210 and 220 generate the reference voltages $REF_{210}$ and $REF_{220}$ according to the switching signal SW.

For example, during an initial period, the regulator 230 provides the reference voltage $REF_{230}$. In this period, the regulator 21 may or may not provide the reference voltage $REF_{210}$. When the controller 110 generates the control signal CON1 to direct the regulator 230 to stop providing the reference voltage $REF_{230}$, the regulator 210 provides the reference voltage $REF_{210}$. When the reference voltage $REF_{210}$ is not within a predetermined range, the regulator 220 provides the reference voltage $REF_{220}$. At this time, the reference voltage $REF_{220}$ is provided as the reference voltage REF1. When the reference voltage $REF_{220}$ is not lower than a predetermined value, the regulator 220 continuously provides the reference voltage $REF_{220}$ or the regulator 210 provides the reference voltage $REF_{210}$. However, when the reference voltage $REF_{220}$ is lower than the predetermined value, the regulators 210, 220 and 230 stop working. At this time, the controller 110 performs a reset operation. After the reset operation, the regulator 230 starts providing the reference voltage $REF_{230}$. At this time, the regulator 210 may or may not provide the reference voltage $REF_{210}$.

In the present disclosure, the time point when the regulator 230 provides the reference voltage $REF_{230}$ is not limited. In one embodiment, when the controller 110 operates in a first mode, the controller 110 generates the control signal CON1 to control the regulator 230 to provide the reference voltage $REF_{230}$. At this time, the regulator 210 may or may not generate the reference voltage $REF_{210}$ according to the switching signal SW generated from the voltage detector 122. When the controller 110 operates in a second mode, the controller 110 sends the control signal CON1 to direct the regulator 230 to stop providing the reference voltage $REF_{230}$.

When the controller 110 operates in the first mode, the controller 110 has a first power consumption. When the controller 110 operates in the second mode, the controller 110 has a second power consumption. The second power consumption is smaller than the first power consumption. In one embodiment, the first mode is a normal mode, and the second mode is a power saving mode, a standby mode or a sleep mode.

Figure 3:
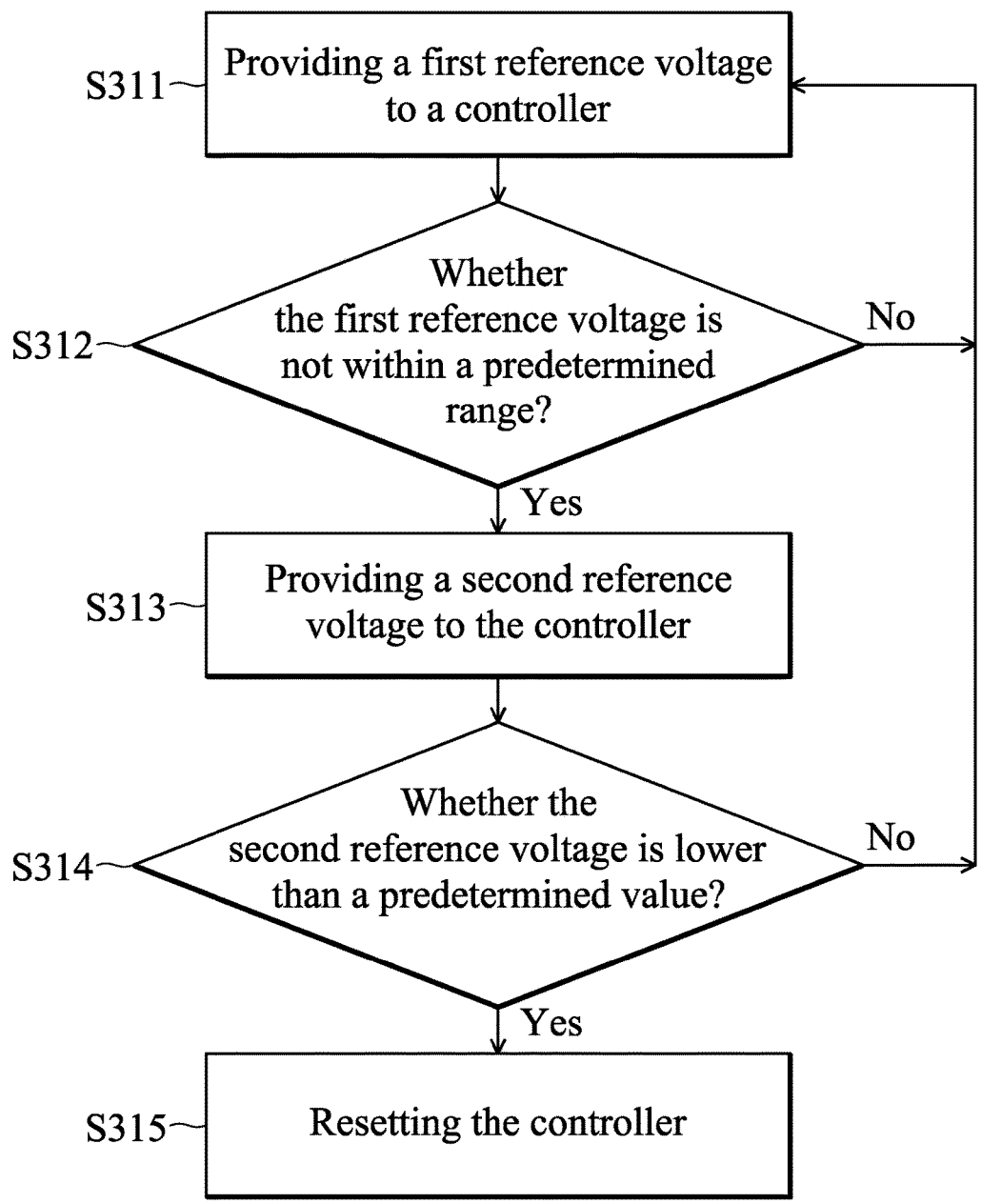
FIG. 3 is a flowchart of an exemplary embodiment of a processing method, according to various aspects of the present disclosure.

FIG. 3 is a flowchart of an exemplary embodiment of a processing method, according to various aspects of the present disclosure. The processing method is capable of applying the operation system shown in FIG. 1. First, a first reference voltage is provided to a controller (step S311). In one embodiment, a first regulator is utilized to provide the first reference voltage to the controller. In another embodiment, step S311 further provides a first current to the controller.

Next, a detection is made as to whether the first reference voltage is not within a predetermined range (step S312). In one embodiment, the predetermined range is 2.4V~1.5V, but the disclosure is not limited thereto. When the first reference voltage is within the predetermined range, step S311 is executed to continuously generate the first reference voltage to the controller. However, when the first reference voltage is not within the predetermined range, it means that the first reference voltage is unstable. Therefore, a second reference voltage is provided to the controller (step S313). In one embodiment, step S311 utilizes a second regulator to provide the second reference voltage. The second reference voltage may be equal to the first reference voltage. In this embodiment, step S313 further provides a second current to the controller. The second current provided from step S313 may be greater than the first current provided in step S311.

Then, a detection is made as to whether the second reference voltage is lower than a predetermined value (step S314). When the second reference voltage is not lower than the predetermined value, step S311 is performed to provide the first reference voltage to the controller such that the reference voltage received by the controller is maintained at a stable level. However, when the second reference voltage is lower than the predetermined value, the controller is reset (step S315).

Figure 4:
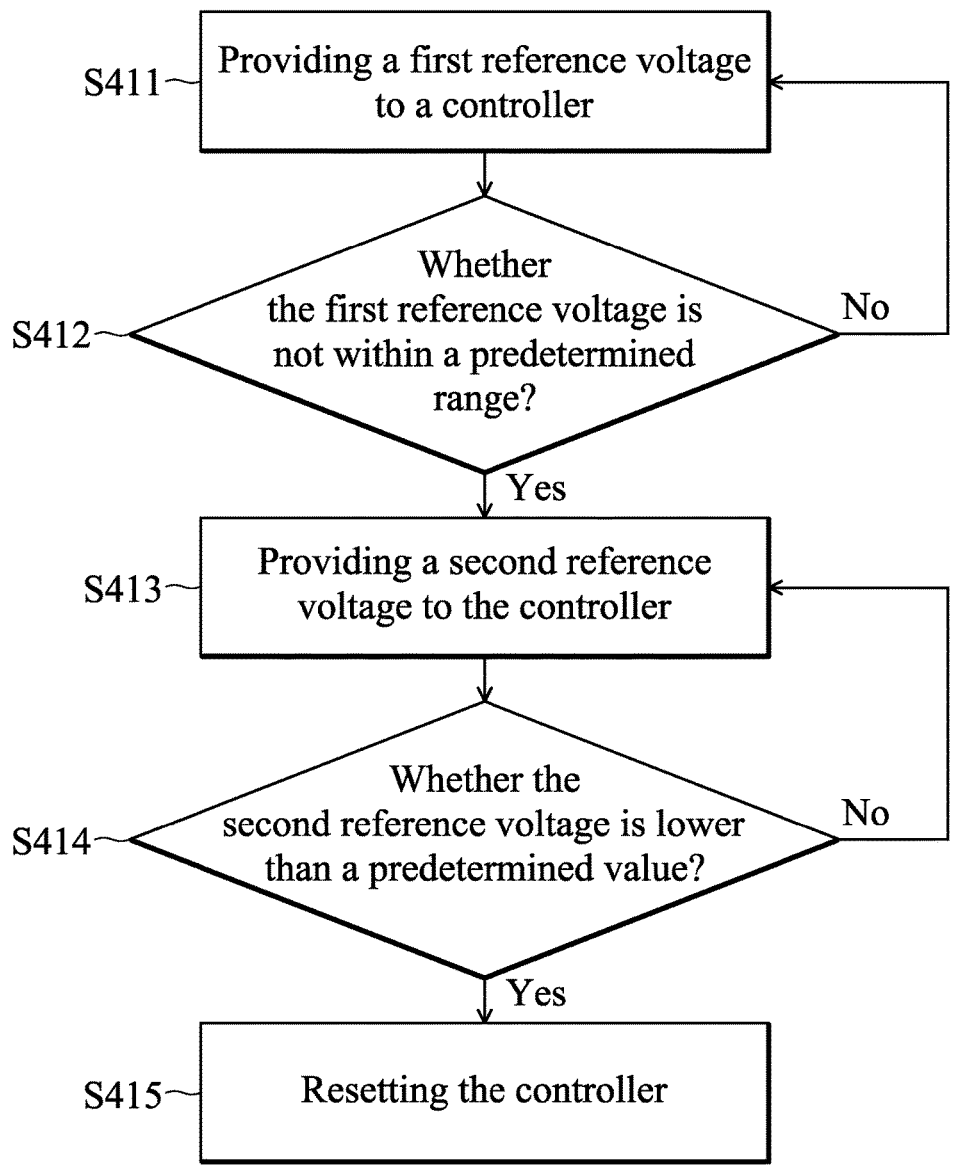
FIG. 4 is a flowchart of another exemplary embodiment of the processing method, according to various aspects of the present disclosure.

FIG. 4 is a flowchart of another exemplary embodiment of the processing method, according to various aspects of the present disclosure. FIG. 4 is similar to FIG. 3 except that step S412 is performed to continuously provide the second reference voltage to the controller when the second reference voltage is not lower than the predetermined value. Since the features of steps S411~S413 and S415 shown in FIG. 4 are the same as the features of steps S311~S313 and S315 shown in FIG. 3, the descriptions of the features of steps S411~S413 and S415 shown in FIG. 4 are omitted.

Figure 5:
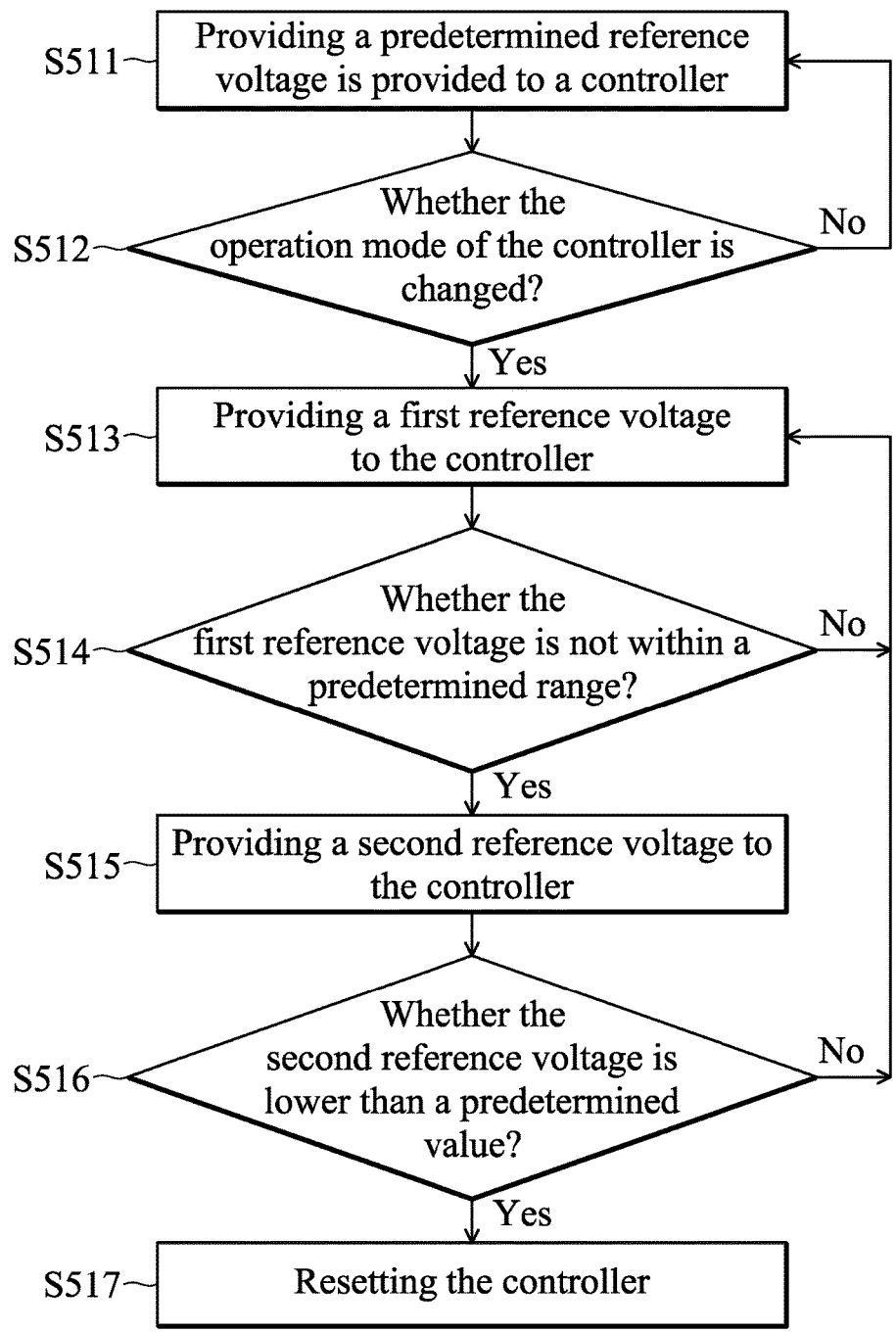
FIG. 5 is a flowchart of another exemplary embodiment of the processing method, according to various aspects of the present disclosure.

FIG. 5 is a flowchart of another exemplary embodiment of the processing method, according to various aspects of the present disclosure. FIG. 5 is similar to FIG. 3 except for the addition of steps S511 and S512. Since the features of steps S513~S517 shown in FIG. 5 are the same as the features of steps S311~S313 shown in FIG. 3, the descriptions of the features of steps S513~S517 shown in FIG. 5 are omitted.

In step S511, a predetermined reference voltage is provided to the controller. In one embodiment, step S511 also provides the first reference voltage to the controller. The first reference voltage may be the same as or different from the predetermined reference voltage. For example, the first reference voltage may be lower than the predetermined reference voltage. In other embodiments, step S511 also provides a third current to the controller. In one embodiment, the third current provided in step S511 may be greater than the first current provided in step S513 and the second current provided in step S515.

Step S512 determines whether the operation mode of the controller is changed. When the operation mode of the controller is not changed, such as in a first mode, step S511 is performed to continuously provide the predetermined reference voltage to the controller. However, when the operation mode of the controller is changed, such as from the first mode to a second mode, step S513 is performed to stop providing the predetermined reference voltage to the controller and start providing the first reference voltage to the controller.

In this embodiment, step S516 determines whether the second reference voltage is lower than a predetermined value. When the second reference voltage is not lower than the predetermined value, step S513 is performed to provide the first reference voltage to the controller. However, in another embodiment, when the second reference voltage is not lower than the predetermined value, step S515 is performed to continuously provide the second reference voltage to the controller.

In this embodiment, since the stable reference voltage is provided to the controller, the operation of the controller is maintained. Furthermore, when the reference voltage is unstable, the controller is reset to avoid the malfunction of the controller.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant an and will not be interpreted in an idealized or overly formal sense unless expressly so defined herein.

While the invention has been described by way of example and in ten is of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A processing circuit, comprising:
a reference voltage generator configured to provide a first reference voltage to a controller; and
a voltage detector configured to detect the first reference voltage,
wherein when the first reference voltage is not within a predetermined range, the voltage detector triggers the reference voltage generator such that the reference voltage generator provides a second reference voltage to the controller, and
wherein when the second reference voltage is lower than a predetermined value, the voltage detector resets the controller to turn off the controller.

2. The processing circuit as claimed in claim 1, wherein the reference voltage generator comprises:
a first regulator providing the first reference voltage according to an input voltage; and
a second regulator providing the second reference voltage according to the input voltage.

3. The processing circuit as claimed in claim 2, wherein the first reference voltage is equal to the second reference voltage.

4. The processing circuit as claimed in claim 2, wherein the first regulator provides a first current to the controller, the second regulator provides a second current to the controller, and the first current is lower than the second current.

5. The processing circuit as claimed in claim 2, wherein the reference voltage generator further comprises:

a third regulator providing a third reference voltage according to the input voltage,
wherein the third reference voltage is higher than the first reference voltage,
wherein when the controller operates in a first mode, the reference voltage generator provides the third reference voltage to the controller, and
wherein when the controller operates in a second mode, the reference voltage generator provides the first reference voltage to the controller.

6. The processing circuit as claimed in claim 5, wherein when the controller operates in the first mode, the controller has a first power consumption, and when the controller operates in the second mode, the controller has a second power consumption, which is lower than the first power consumption.

7. The processing circuit as claimed in claim 4, wherein the third regulator provides a third current to the controller, and the third current is greater than the first current.

8. The processing circuit as claimed in claim 1, wherein when the first reference voltage is within the predetermined range, the reference voltage generator continuously provides the first reference voltage to the controller.

9. The processing circuit as claimed in claim 1, wherein when the second reference voltage is not lower than the predetermined value, the voltage detector triggers the reference voltage generator such that the reference voltage generator provides the first reference voltage to the controller.

10. The processing circuit as claimed in claim 1, wherein when the second reference voltage is not lower than the predetermined value, the reference voltage generator continuously provides the second reference voltage to the controller.

11. A processing method comprising:
providing a first reference voltage to a controller;
detecting the first reference voltage;
providing a second reference voltage to the controller when the first reference voltage is not within a predetermined range;
detecting the second reference voltage; and
turning off the controller when the second reference voltage is lower than a predetermined value.

12. The processing method as claimed in claim 11, wherein the first reference voltage is equal to the second reference voltage.

13. The processing method as claimed in claim 11, further comprising:
providing a first current to the controller when the first reference voltage is provided to the controller; and
providing a second current to the controller when the second reference voltage is provided to the controller, wherein the first current is lower than the second current.

14. The processing method as claimed in claim 13, further comprising:
determining an operation mode of the controller;
providing a predetermined reference voltage to the controller when the operation mode of the controller is a first mode; and
providing the first reference voltage to the controller when the operation mode of the controller is a second mode, wherein the predetermined reference voltage is higher than the first reference voltage.

15. The processing method as claimed in claim 14, further comprising:
providing a third current to the controller when the predetermined reference voltage is provided to the controller.

16. The processing method as claimed in claim 11, further comprising:
continuously providing the first reference voltage to the controller when the first reference voltage is within the predetermined range.

17. The processing method as claimed in claim 11, further comprising:
again providing the first reference voltage to the controller when the second reference voltage is not lower than the predetermined value.

18. The processing method as claimed in claim 11, further comprising:
continuously providing the second reference voltage to the controller when the second reference voltage is not lower than the predetermined value.

* * * * *